US011756957B2

(12) United States Patent
Wu et al.

(10) Patent No.: US 11,756,957 B2
(45) Date of Patent: Sep. 12, 2023

(54) REDUCING GATE RESISTANCE IN STACKED VERTICAL TRANSPORT FIELD EFFECT TRANSISTORS

(71) Applicant: International Business Machines Corporation, Armonk, NY (US)

(72) Inventors: Heng Wu, Guilderland, NY (US); Chen Zhang, Guilderland, NY (US); Kangguo Cheng, Schenectady, NY (US); Tenko Yamashita, Schenectady, NY (US); Joshua M. Rubin, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/321,563

(22) Filed: May 17, 2021

(65) Prior Publication Data

US 2021/0280578 A1    Sep. 9, 2021

Related U.S. Application Data

(62) Division of application No. 16/395,563, filed on Apr. 26, 2019, now Pat. No. 11,069,679.

(51) Int. Cl.
*H01L 27/088* (2006.01)
*H01L 29/78* (2006.01)
*H01L 21/84* (2006.01)
*H01L 29/66* (2006.01)

(52) U.S. Cl.
CPC ............ *H01L 27/088* (2013.01); *H01L 21/84* (2013.01); *H01L 29/6653* (2013.01); *H01L 29/66666* (2013.01); *H01L 29/7827* (2013.01)

(58) Field of Classification Search
None
See application file for complete search history.

(56) References Cited

U.S. PATENT DOCUMENTS

| | | |
|---|---|---|
| 5,612,563 A | 3/1997 | Fitch et al. |
| 8,354,342 B2 | 1/2013 | Oh et al. |
| 8,450,804 B2 | 5/2013 | Sekar et al. |
| 9,177,890 B2 | 11/2015 | Du |
| 9,680,473 B1 | 6/2017 | Anderson et al. |
| 9,735,253 B1 | 8/2017 | Bi et al. |
| 9,824,933 B1 | 11/2017 | Pawlak |

(Continued)

OTHER PUBLICATIONS

List of IBM Patents or Patent Applications Treated as Related.

*Primary Examiner* — Long Pham
(74) *Attorney, Agent, or Firm* — Fleit Intellectual Property Law; Thomas S. Grzesik

(57) ABSTRACT

A semiconductor device structure and method for fabricating the same. The semiconductor device structure includes a first vertical transport field effect transistor (VTFET) comprising at least a first gate structure having a first gate length, and a second VTFET stacked on the first VTFET and comprising at least a second gate structure having a second gate length that is less than the first gate length. The method includes forming, on a substrate, a first VTFET including at least a first gate structure having a first gate length. The method further includes forming a second VTFET stacked on the first VTFET and including at least a second gate structure having a second gate length that is less than the first gate length.

18 Claims, 13 Drawing Sheets

(56) References Cited

U.S. PATENT DOCUMENTS

| | | |
|---|---|---|
| 9,997,413 B1 * | 6/2018 | Leobandung ......... H01L 27/092 |
| 10,679,904 B2 | 6/2020 | Leobandung |
| 2012/0208364 A1 | 8/2012 | Rouh et al. |
| 2013/0001701 A1 | 1/2013 | Christensen et al. |
| 2013/0003434 A1 | 1/2013 | Lue et al. |
| 2018/0005895 A1 | 1/2018 | Cheng et al. |
| 2018/0218910 A1 | 8/2018 | Harada et al. |
| 2018/0277442 A1 | 9/2018 | Leobandung |
| 2019/0172751 A1 | 6/2019 | Smith et al. |
| 2020/0035691 A1 | 1/2020 | Reznicek et al. |
| 2020/0144264 A1 | 5/2020 | Li et al. |
| 2020/0273755 A1 | 8/2020 | Wu et al. |

\* cited by examiner

REDUCING GATE RESISTANCE IN STACKED VERTICAL TRANSPORT FIELD EFFECT TRANSISTORS

BACKGROUND OF THE INVENTION

The present invention generally relates to the field of semiconductors, and more particularly relates to vertical transport field effect transistors.

Vertical transport field effect transistors (VTFETs or VFETs) are becoming viable device options for semiconductor devices, for example, complementary metal oxide semiconductor (CMOS) devices, beyond 5 nanometer (nm) node. VFET devices include fin channels with source/drain regions at ends of the fin channels on top and bottom sides of the fins. Current runs through the fin channels in a vertical direction (e.g., perpendicular to a substrate), for example, from a bottom source/drain region to a top source/drain region. Vertical transport architecture devices are designed to extend the product value proposition beyond conventional plateaus and address the limitations of horizontal device architectures by, for example, decoupling of gate length from the contact gate pitch. Vertical transistors may provide higher density scaling and allow for relaxed gate lengths to better control device electrostatics, without sacrificing the gate contact pitch size.

SUMMARY OF THE INVENTION

In one embodiment, a method for forming a stacked semiconductor device structure comprises forming, on a substrate, a first vertical transport field effect transistor (VTFET) comprising at least a first gate structure having a first gate length. A second VTFET is formed stacked on the first VTFET and comprises at least a second gate structure having a second gate length that is less than the first gate length.

In another embodiment, a semiconductor device structure comprises a first vertical transport field effect transistor (VTFET) comprising at least a first gate structure having a first gate length, and a second VTFET stacked on the first VTFET and comprising at least a second gate structure having a second gate length that is less than the first gate length.

In a further embodiment, an integrated circuit comprises a stacked vertical transport field effect transistor (VTFET) device. The stacked VTFET device comprises a first vertical transport field effect transistor (VTFET) comprising at least a first gate structure having a first gate length, and a second VTFET stacked on the first VTFET and comprising at least a second gate structure having a second gate length that is less than the first gate length.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

Figure 1:
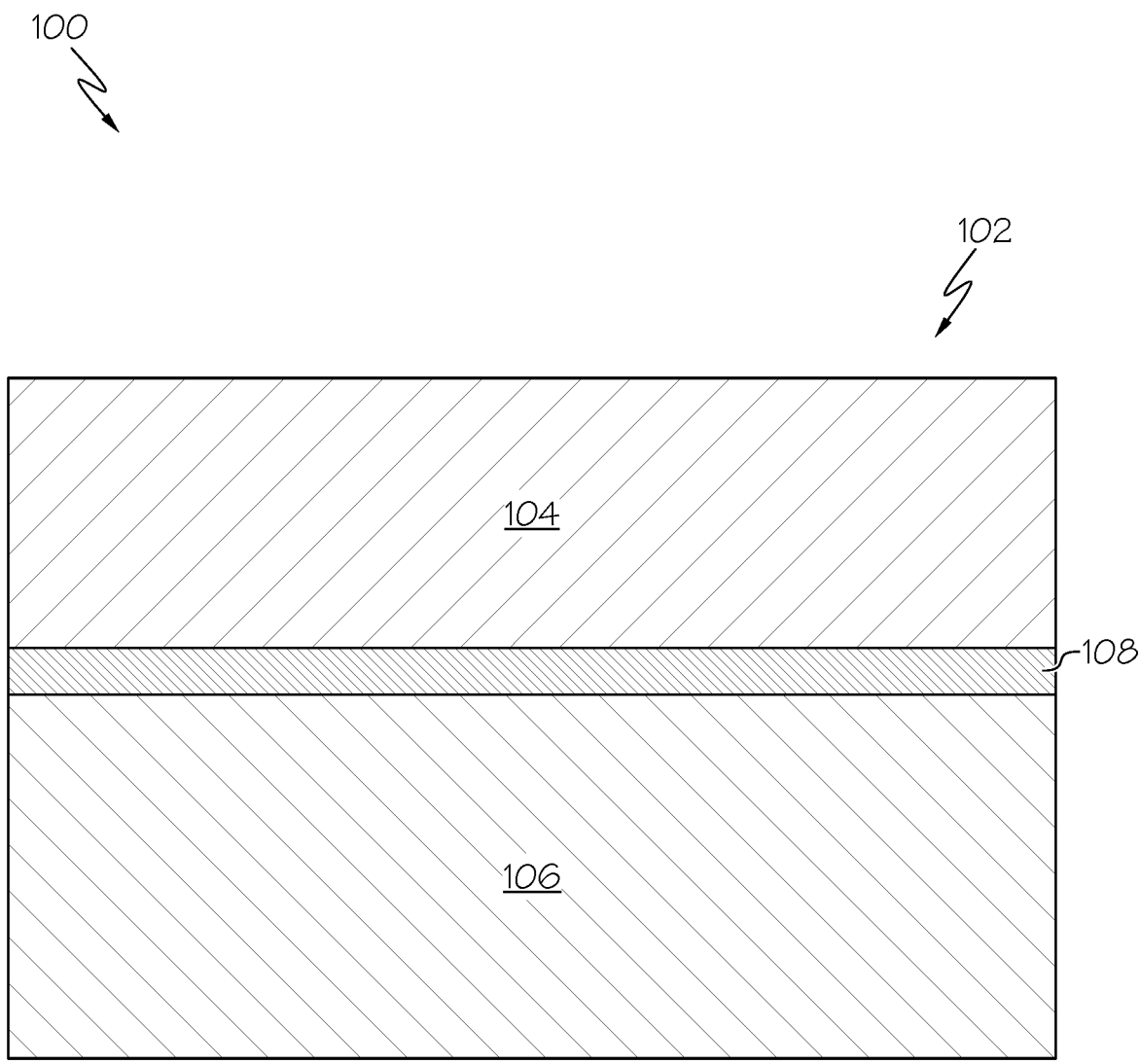
FIG. 1 is a cross-sectional view of a semiconductor device structure comprising a substrate according to one embodiment of the present invention.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present invention may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be understood that the various layers and/or regions shown in the accompanying drawings are not drawn to scale, and that one or more layers and/or regions of a type commonly used in complementary metal-oxide semiconductor (CMOS), field-effect transistor (FET), fin field-effect transistor (finFET), metal-oxide-semiconductor field-effect transistor (MOSFET), and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

Deposition may be any process that grows, coats, or otherwise transfers a material onto the wafer. Available technologies include physical vapor deposition (PVD), chemical vapor deposition (CVD), plasma-enhanced chemical vapor deposition (PECVD), electrochemical deposition (ECD), molecular beam epitaxy (MBE) and more recently, atomic layer deposition (ALD) among others.

Removal may be any process that removes material from the wafer; examples include etch processes (either wet or dry) and chemical-mechanical planarization (CMP).

Patterning refers to the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed by plasma ashing.

Modification of electrical properties has historically entailed doping transistor sources and drains (originally by diffusion furnaces and later by ion implantation). These doping processes are followed by furnace annealing or, in advanced devices, by rapid thermal annealing (RTA); annealing serves to activate the implanted dopants. Modification of electrical properties now also extends to the reduction of a material's dielectric constant in low-k insulators trench exposure to ultraviolet light in UV processing (UVP). Modification is frequently achieved by oxidation, which can be carried out to create semiconductor-insulator junctions, such as in the local oxidation of silicon (LOCOS) to fabricate metal oxide field effect transistors.

VTFET MOSFET is being pursued as a viable technology beyond the 5 nm node. Stacked VTFETs may be utilized to further reduce the area of the device enabling denser circuit layout. Conventional approaches for forming stacked VTFETs generally utilize reactive ion etching (ME) through the top VTFET gate landing on the bottom VTFET gate for form the common gate connection. This process creates an undesirable large gate resistance due to a small interface area between the contact via and thick gate metal (e.g., 8 nm). Embodiments of the present invention overcome this problem by forming a specific gate profile that enlarges the gate contact region to contact via thereby reducing the gate resistance.

FIGS. 1-12 illustrate various processes for forming stacked VTFETs and reducing their gate resistance according to various embodiments of the present invention. FIG. 1 shows a semiconductor device structure 100 comprising a substrate 102. In this embodiment, the substrate 102 may be a silicon-on-insulator (SOI) substrate. However, in other embodiments, the substrate 102 may be a bulk substrate or any other applicable type of substrate. The SOI substrate 102 may comprise a first/top semiconductor layer 104, a second/bottom semiconductor layer 106, and an insulating layer 108 disposed/formed between the first and second semiconductor layers 104, 106. A bottom surface of the first semiconductor layer 104 contacts a top surface of the insulating layer 108, and a top surface of the second semiconductor layer 106 contacts a bottom surface of the insulating layer 108.

The first and second semiconductor layers 104, 106 may be formed utilizing various methods such as a layer transfer process including a bonding step, or an implantation process such as SIMOX (Separation by IMplantation of OXygen).

The first and second semiconductor layers 104, 106 may comprise] the same or different materials. For example, the first and second semiconductor layers 104, 106 may comprise a single crystalline semiconductor material or a polycrystalline material. In other embodiments, the first and second semiconductor layers 104, 106 may include an elemental semiconductor material such as silicon (Si) or germanium (Ge), a semiconductor material primarily composed of Group IV elements such as a silicon-germanium alloy or a silicon-carbon alloy, a III-V compound semiconductor material, a II-VI compound semiconductor material, or an organic semiconductor material. The first and second semiconductor layers 104, 106 may comprise the same or different materials.

Also, the first and second semiconductor layers 104, 106 may comprise undoped single crystalline silicon or single crystalline silicon doped with p-type dopant atoms or n-type dopant atoms. Examples of materials for the first and second semiconductor layers 104, 106 may include, but are not limited to, silicon, germanium, diamond, silicon germanium, silicon carbide, gallium arsenic, indium arsenide, indium phosphide, silicon germanium carbide, gallium arsenic phosphide, gallium indium phosphide, combinations of these, or any other suitable semiconductor material(s) in which fins for multi-gate devices can be formed.

The first and second semiconductor layers 104, 106 may be undoped or doped with either p-type or n-type dopants through ion implantation, plasma doping, or gas phase doping. P-type transistors may be produced by doping the semiconductor material/layer with elements from group III of the periodic table (e.g., boron, aluminum, gallium, indium, etc.). As an example, the dopant can be boron in a concentration ranging from $1\times10^{"}$ atoms/cm$^3$ to $2\times10^{2'}$ atoms/cm$^3$ although other concentrations are applicable as well. N-type transistors may be produced by doping the semiconductor material/layer with elements from group V of the periodic table (e.g., phosphorus, antimony, arsenic, etc.).

The insulating layer 108 may be formed from any of several dielectric materials. Non-limiting examples include, for example, oxides, nitrides and oxynitrides of silicon. The insulating layer 108 may also include oxides, nitrides and oxynitrides of elements other than silicon. In addition, the insulating layer 108 may include crystalline or non-crystalline dielectric material. Moreover, the insulating layer 108 may be formed using any of several methods. Non-limiting examples include ion implantation methods, thermal or plasma oxidation or nitridation methods, chemical vapor deposition methods and physical vapor deposition methods. The insulating layer 108 may include a thickness ranging from about 5 nm to about 200 nm. In one embodiment, the insulating layer 108 may be about 25 nm thick.

Figure 2:
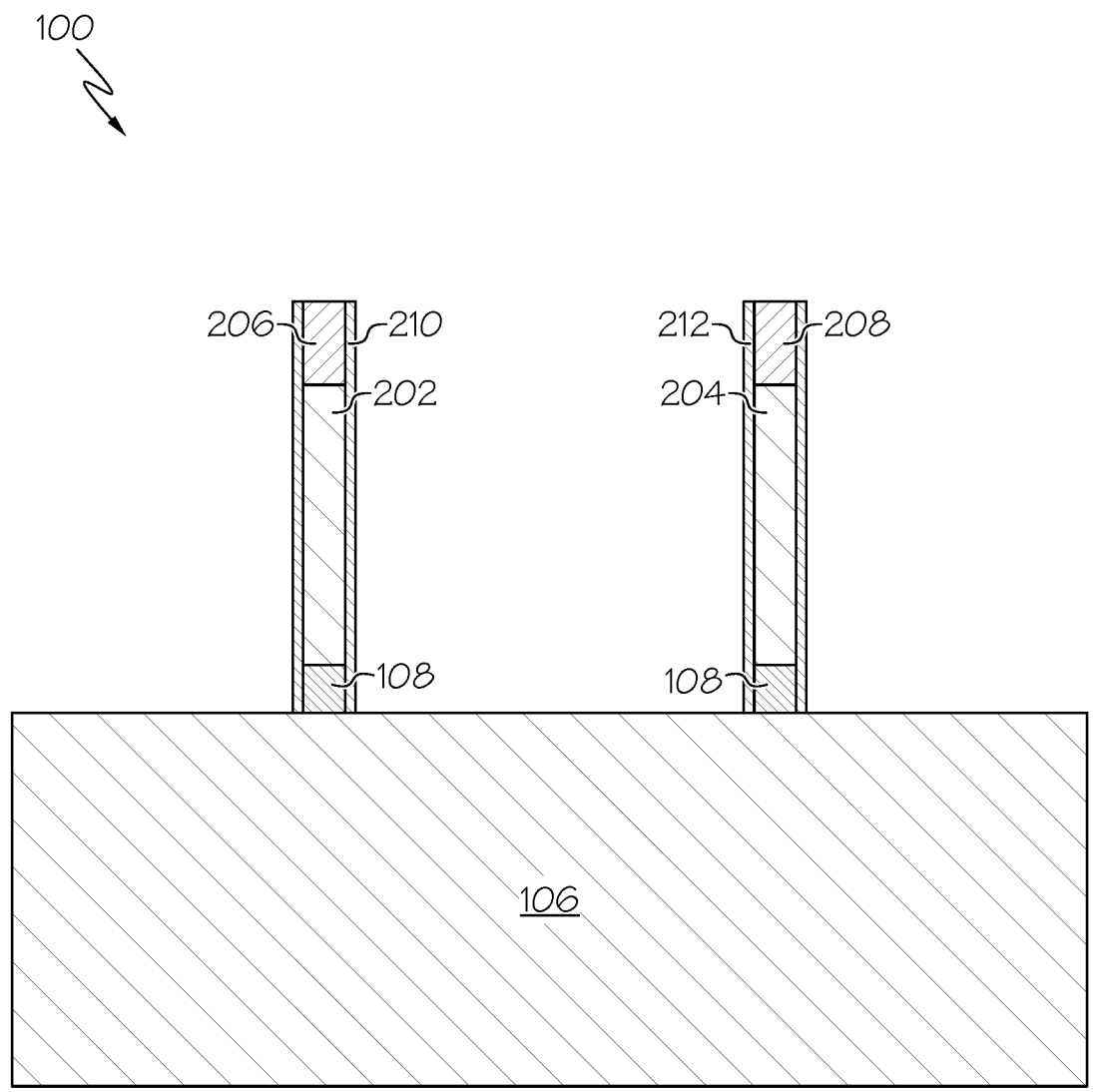
FIG. 2 is a cross-sectional view of the semiconductor device structure after a top set of semiconductor fins have been formed for a top VTFET according to one embodiment of the present invention.

FIG. 2 shows that a first/top set of fin structures 202, 204 may be formed from the first semiconductor layer 104 for a first VTFET device(s). The fin 202, 204 may be formed by forming an etch-stop hard mask onto the first semiconductor layer 104 through, for example, deposition. The etch-stop hard mask may be made of, for example, silicon oxide, silicon oxynitride, silicon carbide, silicon oxycarbide, silicon nitride, titanium nitride, tetraethyl orthosilicate, a combination thereof, and/or other materials suitable in providing etch-stop function. The fin 202, 204 is subsequently formed or etched out of the first semiconductor layer 104 through a process involving masking, using industry-standard lithographic techniques, and directionally etching (e.g., RIE) the etch-stop capping layer, the underlying semiconductor layer 104, and the underlying insulating layer 108. After the RIE etching process, the photo-resist mask used in the lithographic etching process may be removed, leaving fin 202, 204, patterned hard mask 206, 208, and a patterned insulating layer 108. In some embodiments, there may be different pitches between two or more of the fin structures to define different devices. The fin 202, 204 may have a height of 30-50 nm although other heights are applicable as well. The patterned insulating layer 108 insulates the top fin structures 202, 204 from subsequently formed bottom fin structures.

FIG. 2 further shows that an optional spacer/liner 210, 212 is formed on the sidewalls of the fin 202, 204. The liner 210, 212 may be formed by one or more spacer/liner formation techniques. For example, the first liner 210, 212 may be formed by isotropically depositing a conformal layer of insulating material (e.g., SiN, silicon boron nitride, siliconborocarbonitride or some other dielectric) followed by an anisotropic etch (e.g., reactive ion etch (RIE)) of that material to form spacers only on the sidewalls of the fin 204, 206; patterned insulating layer 108; and patterned hard mask 206, 208. The liners 210, 212 protect the top fin 202, 204 during subsequent processing operations for forming bottom fin structures.

Figure 3:
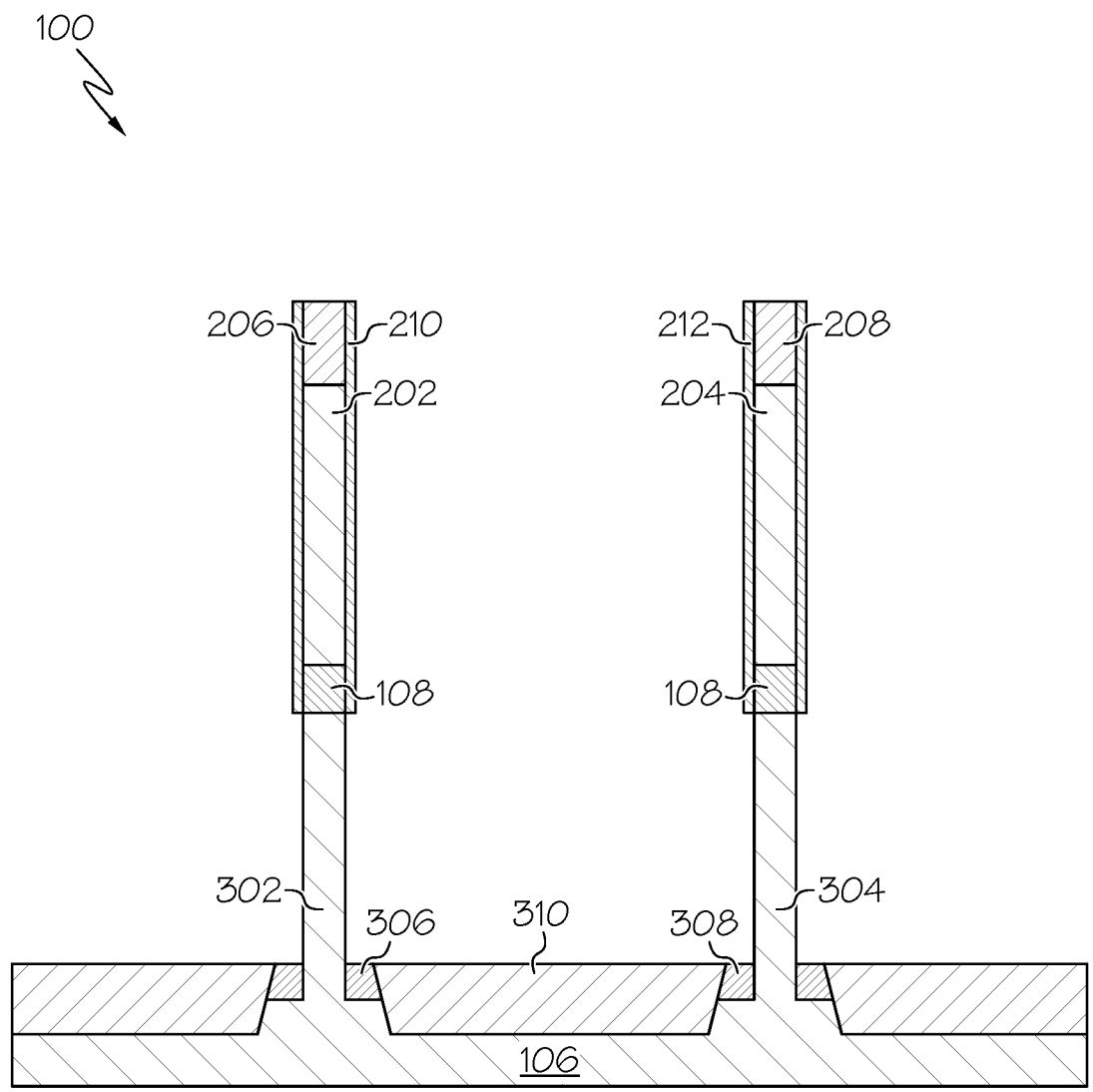
FIG. 3 is a cross-sectional view of the semiconductor device structure after a bottom set of semiconductor fins and a bottom source/drain have been formed for a bottom VTFET according to one embodiment of the present invention.

After the first liner(s) 210, 212 has been formed, the second semiconductor layer 106 may then etched/recessed to form a second/bottom set of fin structures 302, 304 underneath the top fin 202, 204 as shown in FIG. 3. The second semiconductor layer 106 may be recessed using, for example, directional ME. As shown in FIG. 3, the top fin 202, 204 is stacked on top of the bottom fin 302, 304 where the top and bottom fins are insulated from each other by the patterned insulating layer 108. In some embodiments, the top fin 202, 204 and the bottom fin 302, 304 may be considered separate fins or a single fin. In a single fin embodiment, a bottom portion of the single fin is comparable to the bottom fin 302, 304 and a top portion of the single fin is comparable to the top fin 202, 204 throughout this discussion.

After the bottom fin 302, 304 has been formed, the remaining portion of the second semiconductor/substrate layer 106 may be recessed to a bottom source/drain recess utilizing, for example, directional RIE or a lateral etch. A first epitaxial semiconductor layer 306, 308 (also referred to herein as the "first bottom source/drain layer 306, 308") may then be formed. The first bottom source/drain layer 306, 308 may either be a source layer or a drain layer and is formed in contact with the second semiconductor/substrate layer 106 and exposed lower portion of the bottom fin 302, 304. A single bottom source/drain layer 306, 308 (merged) may be formed for multiple fins 302, 304 or a separate bottom source/drain layer 306, 308 may be formed for each fin. Example materials for the first bottom source/drain layer 306, 308 include (but are not limited to) phosphorus doped silicon epitaxy for an nFET device and boron doped silicon germanium epitaxy for a pFET device. The first bottom source/drain layer 306, 308 may comprise the same or different material than the material that provides the bottom fin 302, 304.

In one embodiment, the first bottom source/drain layer 306, 308 may have a thickness of about 10 nm to about 100 nm. However, other thicknesses are applicable as well. The first bottom source/drain layer 306, 308 may be doped with dopant atoms. The dopant atoms may be an n-type dopant (i.e., an element from Group V of the Periodic Table of Elements) or a p-type dopant (i.e., an element from Group III of the Periodic Table of Elements). "N-type" refers to the addition of impurities that contributes free electrons to an intrinsic semiconductor, while "p-type" refers to the addition of impurities to an intrinsic semiconductor that creates deficiencies of valence electrons. Examples of n-type dopants for a group IV semiconductor include phosphorus, arsenic, and antimony. Examples of p-type dopants for a group IV semiconductor include boron, aluminum, and gallium. Examples of n-type dopants for a III-V semiconductor include selenium, tellurium, silicon, and germanium. Examples of p-type dopants for a III-V semiconductor include beryllium, zinc, cadmium, silicon, and germanium.

In some embodiments, the first bottom source/drain layer 306, 308 may be formed by epitaxial growth of a semiconductor material such that the semiconductor material that provides first bottom source/drain layer 306, 308 only from the semiconductor surfaces such as exposed sidewall surfaces of the bottom fin 302, 304, but not from dielectric surfaces, such as surfaces of the isolation regions 310; the liner 210, 212; the fin hard mask 206, 208; etc. The terms "epitaxially growing", "epitaxial growth", "epitaxially grown", and their variants mean the growth of a semiconductor material on a deposition surface of a semiconductor material, in which the semiconductor material being grown has the same crystalline characteristics as the semiconductor material of the deposition surface.

In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on semiconductor surface, and do not deposit material on dielectric surfaces, such as silicon dioxide or silicon nitride surfaces.

Examples of various epitaxial growth process apparatus that are suitable for use in one or more embodiments include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). A number of different sources can be used for the deposition of the various layers discussed herein. For example, the gas source for the deposition of epitaxial semiconductor material can include a silicon containing gas source, a germanium containing gas source, a carbon containing gas source, or a combination thereof. Examples of silicon containing gas sources are silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane, and combinations thereof. Examples of germanium containing gas sources are germane, digermane, halogermane, dichlorogermane, trichlorogermane, tetrachlorogermane and combinations thereof.

After the first bottom source/drain 306, 308 has been formed, an anneal may be performed to drive the dopant in the first bottom source/drain 306, 308 into the bottom fin 302, 304. A thermal anneal process such as laser anneal, flash anneal, rapid thermal anneal (RTA), furnace anneal, or any suitable combination of those annealing techniques may be performed. This process forms a first doped fin region in a portion of the bottom fin 302, 304 laterally contacted by the first bottom source/drain 306, 308. In some embodiments, the junctions may have a height of, for example, 4 nm to 10 nm. Although other dimensions are applicable as well. Collectively, each first doped fin region and the first bottom source/drain 306, 308 may constitute a source or a drain region for each first VTFET subsequently formed. Each first VTFET may be a p-type or n-type FET depending on the conductivity type of the first bottom source/drain 306, 308. It should be noted that the anneal may be performed after the bottom spacer layer 402 (FIG. 4) is formed. The dopant concentration of each bottom source/drain layer 306, 308 may be from $1\times10^{20}$ atoms/cm$^3$ to $1\times10^{22}$ atoms/cm$^3$, although lesser and greater dopant concentration may also be employed.

FIG. 3 also shows that one or more isolation regions 310 such as shallow trench isolation regions may then be formed. For example, a flowable oxide may be deposited over the structure 100 and then a hard mask may be formed to define isolation trenches. The hard mask may be formed by, for example, depositing, and a suitable hard mask material, such as silicon nitride, onto the flowable oxide and then patterned using standard lithography and etching techniques. Trenches are then formed within the exposed oxide down into the second semiconductor/substrate layer 106. Shallow trench isolation (STI) oxide is then deposited within the trench regions forming STI regions 310, as shown in FIG. 3. The flowable oxide, mask, and excess STI oxide are removed via chemical-mechanical polishing (CMP), selective etching, and/or the like. FIG. 3 shows that the resulting STI regions 310 may comprise a top surface that is co-planar with a top surface of the first bottom source/drain layer 306, 308.

Figure 4:
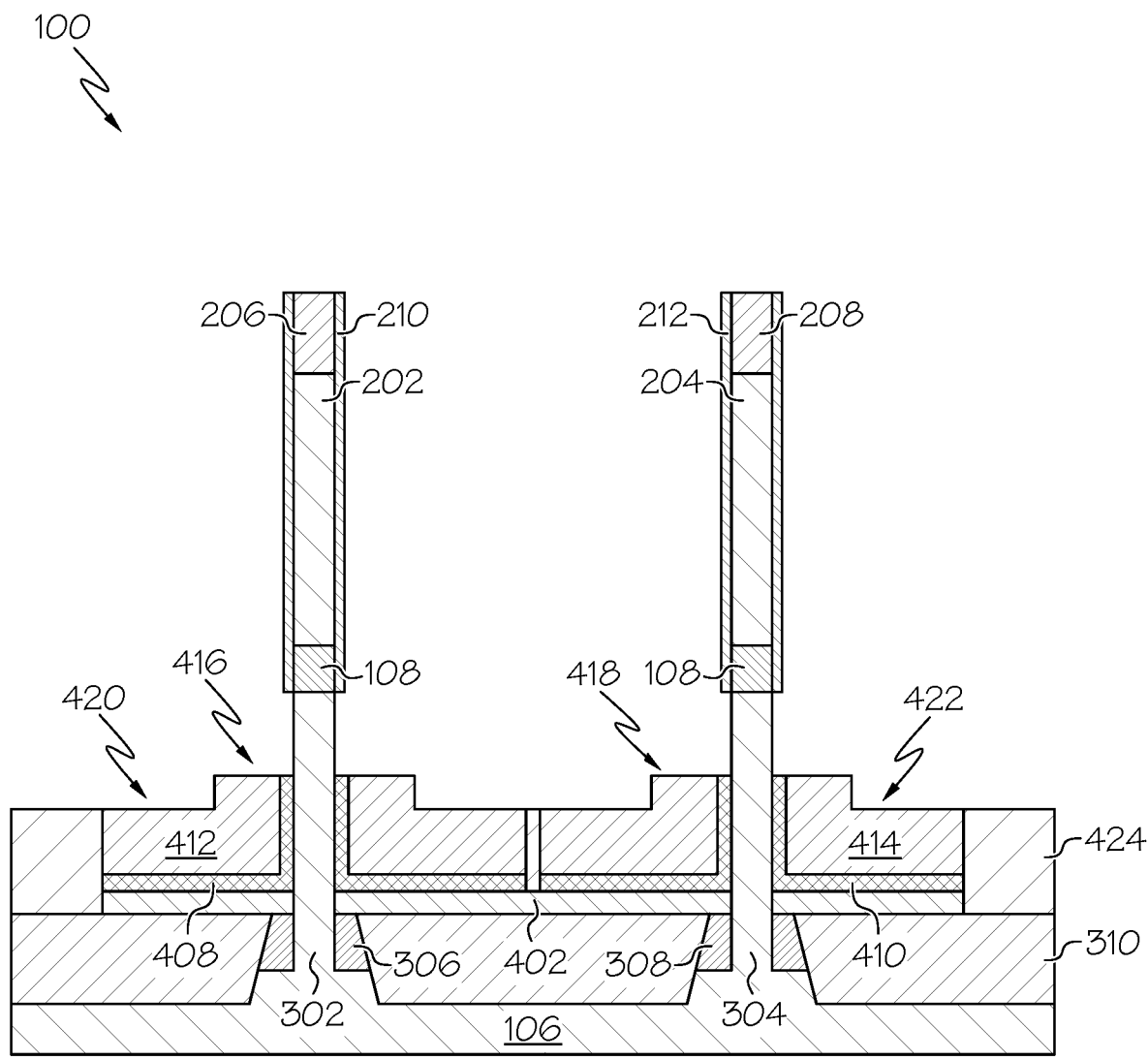
FIG. 4 is a cross-sectional view of the semiconductor device structure after a bottom insulating layer and a gate structure have been formed for the bottom VTFET according to one embodiment of the present invention.

FIG. 4 shows that a first insulating spacer layer 402 (also referred to herein as the "first bottom spacer layer 402") may be subsequently formed on and in contact with the first bottom source/drain layer 306, 308; sidewalls of the bottom fin 302, 304; and a top surface of the isolation regions 310. The first bottom spacer layer 402 may include an insulating material (such as silicon oxide, silicon nitride, silicon oxynitride, or a combination of these) and is formed using any non-conformal deposition process such as, for example, high density plasma (HDP) and physical vapor deposition (PVD) and subsequent etching techniques. The deposited spacer material may then be subsequently etched to form the final spacer structure.

FIG. 4 further shows that after formation of the first bottom spacer layer 402, a first gate structure 404, 406 may be formed on and in contact sidewalls of a channel region of each bottom fin 302, 304. It should be noted that a single gate structure may be formed for multiple fins, or separate gate structures may be formed for each of the multiple fins. The gate structure 404, 406 may comprise an insulating layer 408, 410 formed in contact with and surrounding a portion of the sidewalls of the channel region and a topmost surface of the bottom spacer layer 402. The gate structure 404, 406 may further comprise one or more conductive gate (electrode) layers 412, 414 formed in contact with and surrounding the vertical sidewalls of the insulating layer 408, 410 and a top surface of the bottom spacer layer 306, 308. In other embodiments, the conductive gate layers 412, 414 may be in contact with a top surface of insulating layer portions that are in contact with the bottom spacer layer 306, 308.

In one embodiment, the insulating layer 408, 410 may be a high-k dielectric layer. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The insulating layer 408, 410 may further include dopants such as lanthanum or aluminum.

Examples of conductive gate materials include (but are not limited to) polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, or any suitable combination of these materials. The conductive gate material may further comprise dopants that are incorporated during or after deposition.

The conductive gate (electrode) material may comprise multiple layers such as gate work function setting layer (work function metal) and/or a conductive gate layer. The work function metal be deposited employing CVD, sputtering, or plating. The work function metal layers may comprise one or more metals having a function suitable to tune the work function of NFETs or PFETs. In various embodiments, a work function layer may be a conductive nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a conductive carbide, including but not limited to titanium carbide (TiC), titanium aluminum carbide (TiAlC), tantalum carbide (TaC), hafnium carbide (HfC); or combinations thereof. The work function layer may include multiple layers of work function materials, for example, a work function layer can be a TiN/TiC stack.

The gate structure 404, 406 may be formed by sequentially depositing a conformal gate insulating/dielectric layer over the structure 100 and a conductive gate (electrode) layer on the gate insulating layer. Each of the gate insulating layer and the conductive gate layer may be formed, for example, by CVD, PECVD, PVD, or ALD. After deposition, the conductive gate layer is recessed by an etch. The etch may be a dry etch such as RIE or a wet etch that removes the conductive metal(s) that provides the conductive gate layer selective to the dielectric material(s) that provides the gate insulating layer. In some embodiments when the conductive gate layer 412, 414 includes both work function metal and gate fill metal, two separate etch processes may be performed to recess the gate fill metal and work function metal. Next, end portions of a remaining portion of the conductive gate layer are removed by lithography and etching to provide the conductive gate layer 412, 414. After formation of the conductive gate layer 412, 414, portions of the gate insulating layer that are not covered by the conductive gate layer 412, 414 are removed by an anisotropic etch to provide the insulating layer 408, 410. The anisotropic etch may be a dry etch such as, for example, RIE or a wet etch that removes the dielectric material(s) that provides the gate insulating layer selective to the material that provides the fin hard mask 206, 208; liner 210, 212; the semiconductor material providing the first set of bottom fins 302, 304; and the dielectric material providing the bottom spacer layer 402.

The lithographic and etching processes of the gate materials result in a patterned gate structure 404, 406 surrounding and in contact with the bottom fin 302, 304. In some embodiments, the gate structure 404, 406 comprises a stepped configuration where a first portion 416, 418 comprises a height that is greater than a second portion 420, 422, and where the second portion 420, 422 extends laterally beyond the first portion 416, 418. This configuration ensures a subsequently formed gate contact via lands on gate work function metal correctly with process margin considered.

After the gate structure 404, 406 has been formed, an inter-layer dielectric (ILD) 424 may be formed over the gate structure 404, 406 and the bottom spacer layer 402. The ILD 424 may be formed by depositing a dielectric material over the gate structure 404, 406 and the bottom spacer layer 402 using, for example, CVD or PVD, planarizing the deposited dielectric material by, for example, CMP, and then etching back the deposited dielectric material to the desired thickness. In some embodiments, the planarizing step may be omitted. A topmost surface of the ILD 424 may be located below the topmost surface of the bottom fin 302, 304. A top surface of the ILD 424 may be co-planer with one or more portions of the top surface of the gate structure 404, 406. An anisotropic etch such as, for example, RIE may be employed to remove the dielectric material of the ILD 424 selective to the material the that provides the fin hard mask 206, 208; liner 210, 212; the semiconductor material providing the fin 302, 304; and the dielectric material providing the bottom spacer layer 402.

Figure 5:
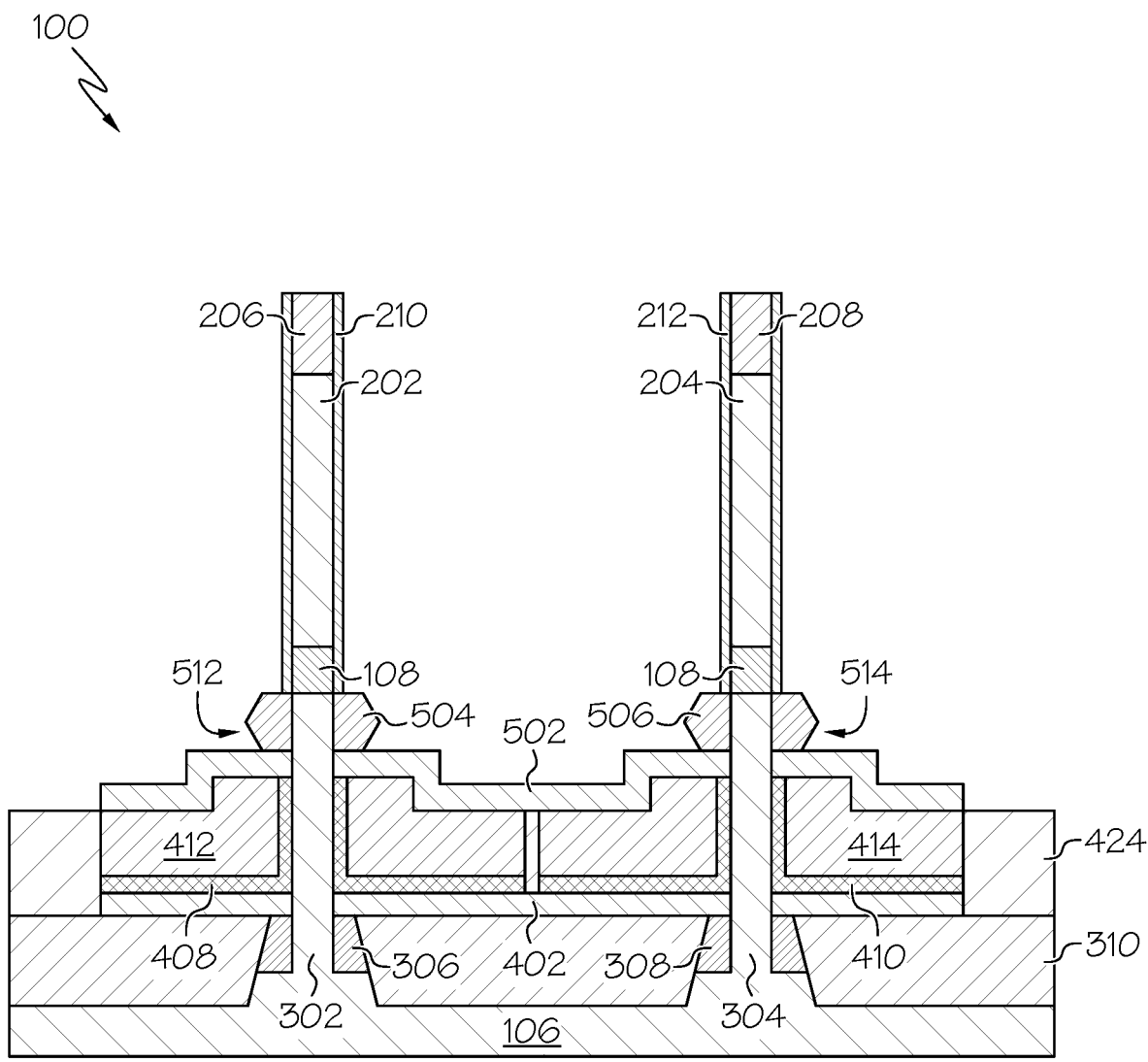
FIG. 5 is a cross-sectional view of the semiconductor device structure after a top insulating layer and top source/drain have been formed for the bottom VTFET according to one embodiment of the present invention.

FIG. 5 shows that after the ILD 424 has been formed, a second insulating spacer 502 (also referred to herein as the "first top spacer layer 502") may be formed on and in contact with a top surface of the gate structure 404, 406 and a top surface of the ILD 424. The first top spacer layer 502 may be composed of a dielectric material that is the same as, or different from, the material that provides the bottom spacer layer 402. In one embodiment, the first top spacer layer 502 may comprise a dielectric oxide such as, for example, silicon dioxide. The first top spacer layer 502 may be formed by depositing a dielectric material over the structure 100 using, for example, CVD or PVD, planarizing the deposited dielectric material by, for example, CMP, and then etching back the deposited dielectric material to the desired thickness. In some embodiments, the planarizing step may be omitted. In at least some embodiments, the first top spacer layer 502 conforms to the gate structure 404, 406 A topmost surface of the first top spacer layer 502 thus is located below the topmost surface of the bottom fin 302, 304. An anisotropic etch such as, for example, RIE may be employed to remove the dielectric material of the first top spacer layer 502 selective to the material the that provides the fin hard mask 206, 208; liner 210, 212; and the semiconductor material providing the bottom fin 302, 304.

FIG. 5 further shows that after the first top spacer layer 502 has been formed, a second epitaxial semiconductor region 504, 506 (also referred to herein as the "first top source/drain layer 504, 506") may then be formed in contact with at least the top portion of the bottom fin 302, 304. The top source/drain layer 504, 506 may be formed using an epitaxy process as discussed above with respect to the bottom source/drain 306, 308. For example, selective epitaxy may be used to grow material from the exposed sidewalls of the bottom fin 302, 304 to form the top source/drain layer 504, 506. The top source/drain layer 504, 506 may either be a source layer or a drain layer and may comprise in-situ doping (e.g., boron, in one embodiment for pFET and phosphorus, in one embodiment, for nFET). It should be noted that, according to one embodiment, the top source/drain layer 504, 506 may not contain any doping. Doping may be performed using any standard approach such as ion implantation. In particular, due to the slower growth rates on (111) orientated surface during the epitaxial growth so that faceted top source/drain layer 504, 506 are obtained. However, it should be noted that, non-faceted epitaxy and/or multiple epitaxy steps can be used to form the top source/drain layer 504, 506 without limiting the scope of the present invention. A single top source/drain layer 504, 506 (merged) may be formed for multiple fins 302, 304 or a separate top source/drain layer 504, 506 may be formed for each fin.

Each top source/drain layer 504, 506 may include a semiconductor material that is the same as, or different from, the semiconductor material that provides the bottom source/drain layer 306, 308. Each top source/drain layer 504, 506 may also comprise a dopant having a same conductivity type as that of the dopant in the bottom source/drain layer 306, 308. In one embedment, both the bottom source/drain layer 306, 308 and top source/drain layer 504, 506 are doped with a p-type dopant for formation of p-type FETs. In another embodiment, both the bottom source/drain layer 306, 308 and top source/drain layer 504, 506 are doped with an n-type dopant for formation of n-type FETs. The dopant concentration of each top source/drain layer 504, 506 may be from $1\times10^{20}$ atoms/cm$^3$ to $1\times10^{21}$ atoms/cm$^3$, although lesser and greater dopant concentration may also be employed.

Each top source/drain layer 504, 506 may be formed utilizing a selective epitaxial growth process discussed above with respect to the formation of the bottom source/drain layer 306. During the selective epitaxial growth, the semiconductor material that provides the top source/drain layer 504, 506 may only grows from the exposed sidewall surfaces of each fin 302, 304, but not from the dielectric surfaces such as exposed surfaces of the first top spacer layer 502; the liner 210, 212; and the fin hard mask. 206, 208. The dopant may be provided during the selective epitaxial growth process by in-situ doping, or after the selective epitaxial growth process by ion implantation or gas phase doping.

Subsequently, an anneal may be performed to drive the dopant in the top source/drain layer 504, 506 into a portion of each fin 302, 304 adjoined to the top source/drain layer 504, 506, thus forming a second doped fin region within each fin 302, 304. Collectively, a top source/drain layer 504, 506 and a second doped fin region laterally contacted by the second top source/drain layer 504, 506 may constitute another source/drain region for each first VTFET. A sacrificial layer such as a sacrificial SiO2 layer (not shown) may then be formed and patterned over the first top spacer layer 502 and top source/drain layer 504, 506. The sacrificial layer may be subsequently etched away for forming middle-of-the line contacts for one or more of the bottom source/drain layers 306, 308 and/or one or more of the top source/drain layers 504, 506.

A first (bottom) VTFET 510, 512 is thus formed in a lower portion of the structure 100. The first VTFET 510, 512 comprises, from bottom to top, a first source/drain region including a first doped fin region located within the bottom fin 302, 304 and a first bottom source/drain layer 306, 308 laterally contacting the first doped fin region; a first gate structure 404, 406 laterally contacting a channel region of the bottom fin 302, 304; and a second source/drain region including a second doped fin region located within the bottom fin 302, 304 and a first top source/drain layer 504, 506 laterally contacting the second doped fin region. The first source/drain region of the first VTFET may be separated from the first gate structure 404, 406 by a first bottom spacer layer 402 disposed between the first bottom source/drain layer 306, 308 and the first gate structure 404, 406. The second source/drain region of the first VTFET 510, 512 may be separated from the first gate structure 404, 406 by the first top spacer layer 502 disposed between the first top source/drain layer 504, 506 and the first gate structure 404, 406. It should be noted that embodiments of the present invention are not limited to the processes discussed above for forming the first set of VTFETs 510, 512, as other processes are applicable as well.

Figure 6:
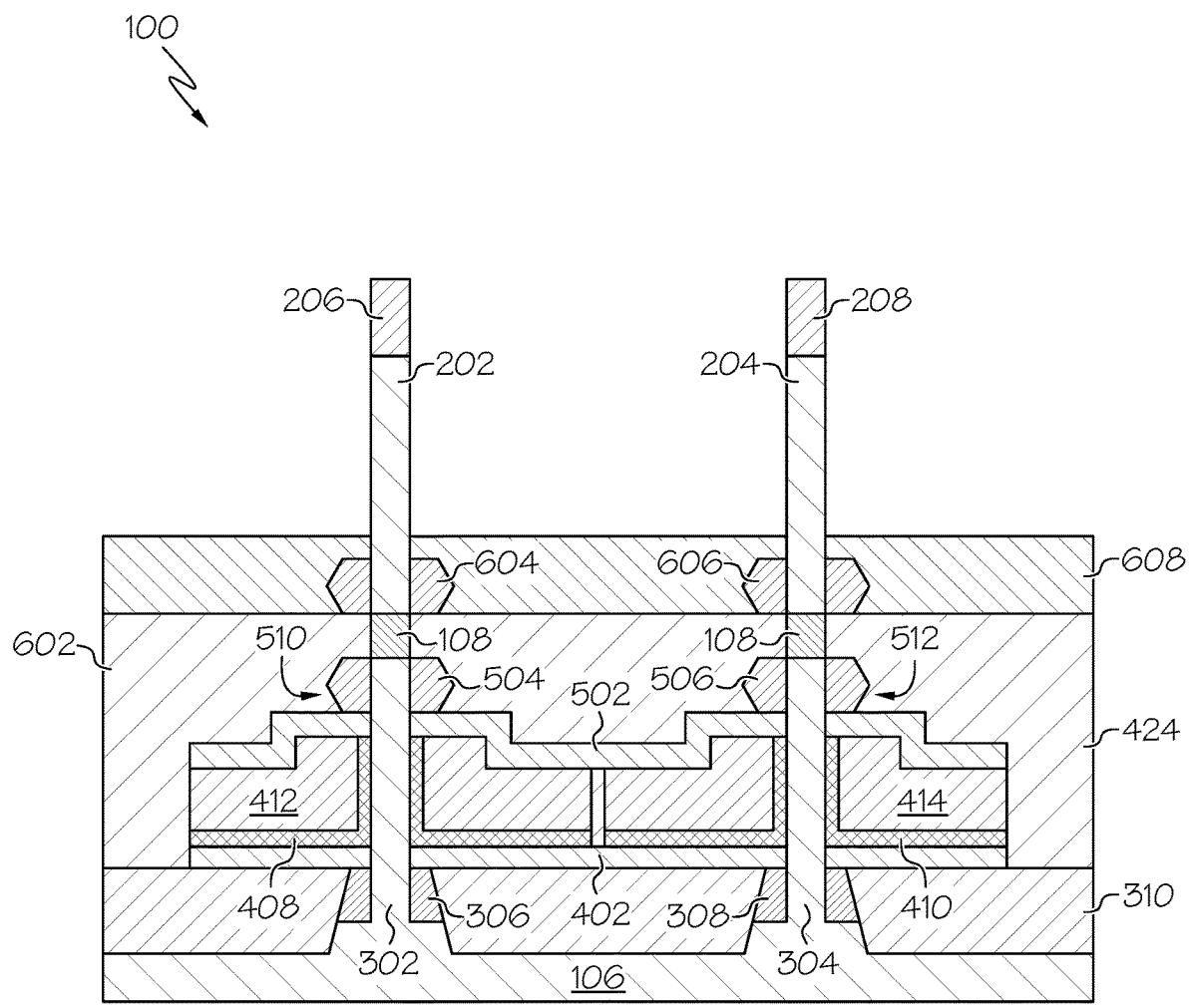
FIG. 6 is a cross-sectional view of the semiconductor device structure after a bottom source/drain and bottom insulating layer have been formed for the top VTFET according to one embodiment of the present invention.

After the first VTFET 510, 512 has been formed, the spacer/liner 210, 212 is removed from the patterned insulating layer 108; top fin 202, 204; and hard mask 206, 208, as shown in FIG. 6. An ILD 602 may then be deposited and etched/polished down to a desired thickness. In one embodiment, a top surface of the ILD 602 is co-planar with a top surface of the patterned insulating layer 108 although the ILD 602 may be polished down below or above the patterned insulating layer 108.

A second VTFET may then be formed stacked on the first VTFET 510, 512 and separated by the patterned insulating layer 108. For example, FIG. 6 shows that after the ILD 602 has been formed, a third epitaxial semiconductor layer 604, 606 (also referred to as the "second bottom source/drain layer 604, 606") may be formed similar to first bottom source/drain layer 306, 308 discussed above with respect to FIG. 3. In some embodiments, if multiple fins 202, 204 have been formed a separate bottom source/drain layer 604, 606 may be formed or a merged bottom source/drain layer 604, 606 may be formed.

The second bottom source/drain layer 604, 606 may include a semiconductor material that is the same as, or different from, the semiconductor material that provides each first top source/drain 504, 506 layer. The second bottom source/drain layer 604, 606 may comprise a dopant having a second conductivity type. The second conductivity type may be the same as, or different from the first conductivity type of the first bottom source/drain layer 306, 308. For example, in instances where the first conductivity is p-type, the second conductivity type can be n-type or p-type. The dopant concentration of each t second bottom source/drain layer 604, 606 may be the same as, or different from the dopant concentration of each first top source/drain 504, 506 layer. In one embodiment, the dopant concentration of each second bottom source/drain layer 604, 606 may be from $1\times10^{20}$ atoms/cm$^3$ to $1\times10^{21}$ atoms/cm$^3$, although lesser and greater dopant concentrations may also be employed.

The second bottom source/drain layer 604, 606 may be formed utilizing a selective epitaxial growth process discussed above with respect to the formation of the first bottom source/drain layer 306, 308. During the selective epitaxial growth, the semiconductor material that provides the first bottom source/drain layer 306, 308 only grows from semiconductor surfaces including exposed sidewall surfaces of each semiconductor fin 202, 204, but not from the dielectric surfaces such as the fin hard mask 206, 208 and ILD 602. The dopant may be provided during the selective epitaxial growth process by in-situ doping, or after the selective epitaxial growth process by ion implantation or gas phase doping.

After the second bottom source/drain layer 604, 606 been formed, an anneal may be performed to drive the dopant in the second bottom source/drain layer 604, 606 into the top fin 202, 204. A thermal anneal process such as laser anneal, flash anneal, rapid thermal anneal (RTA), furnace anneal, or any suitable combination of those annealing techniques may be performed. This process forms a third doped fin region in a portion of the top fin 202, 204 laterally contacted by the second bottom source/drain layer 604, 606. In some embodiments, the junctions may have a height of, for example, 4 nm to 10 nm. Although other dimensions are applicable as well.

Collectively, each third doped fin region and the second bottom source/drain layer 604, 606 may constitute a source or a drain region for each second VTFET subsequently formed. Each second VTFET may be a p-type or n-type FET depending on the conductivity type of the second bottom source/drain layer 604, 606. It should be noted that the anneal may be performed after the bottom spacer layer 608 is formed. The dopant concentration of second bottom source/drain layer 604, 606 may be from $1\times10^{20}$ atoms/cm$^3$ to $1\times10^{22}$ atoms/cm$^3$, although lesser and greater dopant concentrations may also be employed.

FIG. 6 further shows that a third insulating spacer layer 608 (also referred to herein as the "second bottom spacer layer 608") may be subsequently formed on and in contact with the first second bottom source/drain layer 604, 606; sidewalls of the top fin 202, 204; and a top surface of the ILD 602. The second bottom spacer layer 608 may include an insulating material (such as silicon oxide, silicon nitride, silicon oxynitride, or a combination of these) and is formed using any non-conformal deposition process such as, for example, high density plasma (HDP) and physical vapor deposition (PVD) and subsequent etching techniques. The deposited spacer material may then be subsequently etched to form the final spacer structure.

Figure 7:
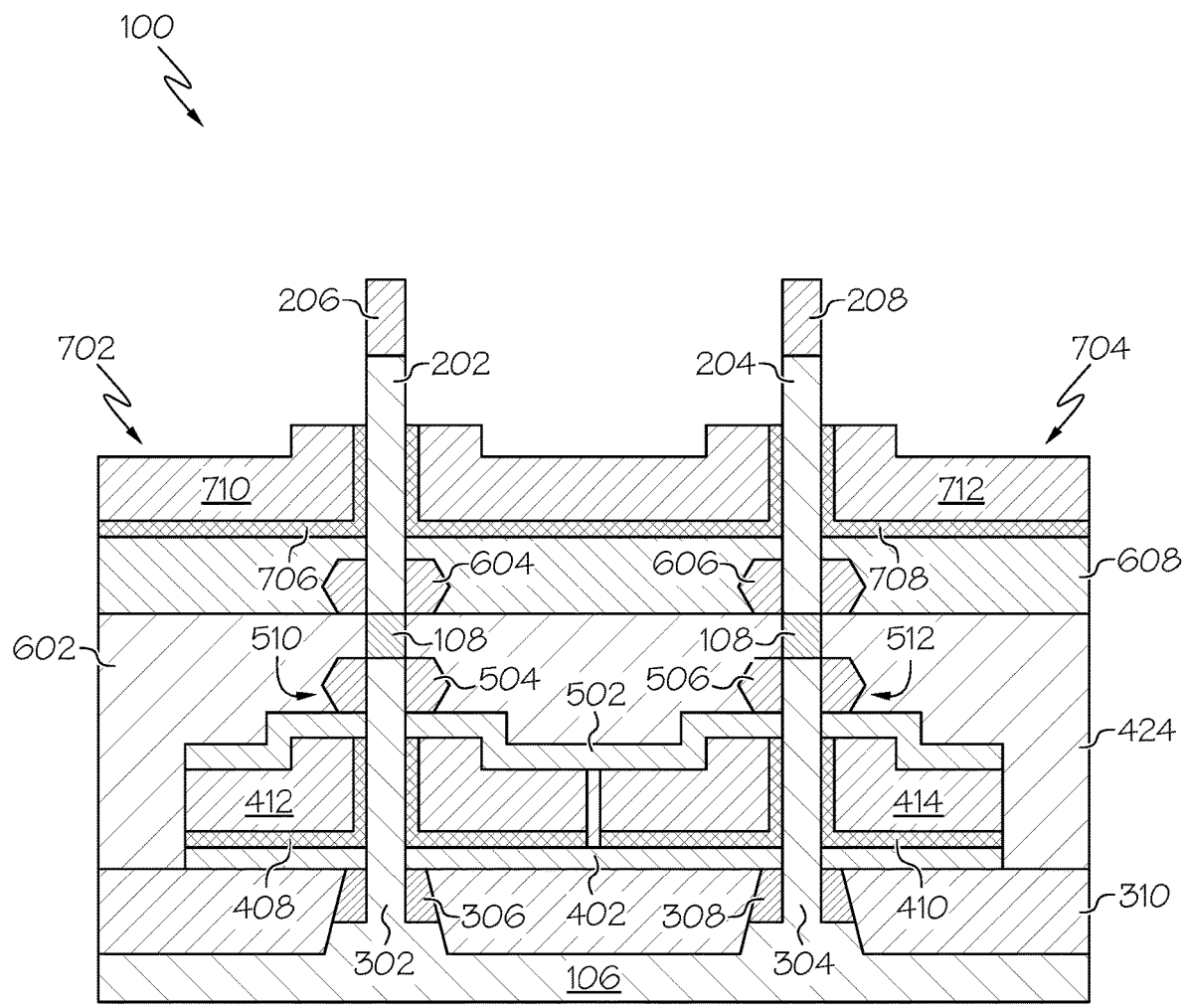
FIG. 7 is a cross-sectional view of the semiconductor device structure after a gate structure has been formed for the top VTFET according to one embodiment of the present invention.

After the second bottom spacer layer 608 has been formed, a second gate structure 702, 704 may be formed as shown in FIG. 7. The second gate structure 702, 704 may be formed on and in contact sidewalls of a channel region of the top fin 202, 204 and a top surface of the second bottom spacer layer 608. It should be noted that a single gate structure may be formed for multiple fins, or separate gate structures may be formed for each of the multiple fins. The gate structure 702, 704 may comprise an insulating layer 706, 708 formed in contact with and surrounding a portion of the sidewalls of the channel region and a topmost surface of the second bottom spacer layer 608. The second gate structure 702, 704 may further comprise one or more conductive gate (electrode) layers 710, 712 formed in contact with and surrounding the vertical sidewalls of the insulating layer 706, 708 and a top surface of the second bottom spacer layer 608. In other embodiments, the conductive gate layers 710, 712 may be in contact with a top surface of insulating layer portions 706, 708 that are in contact with the second bottom spacer layer 608.

Figure 8:
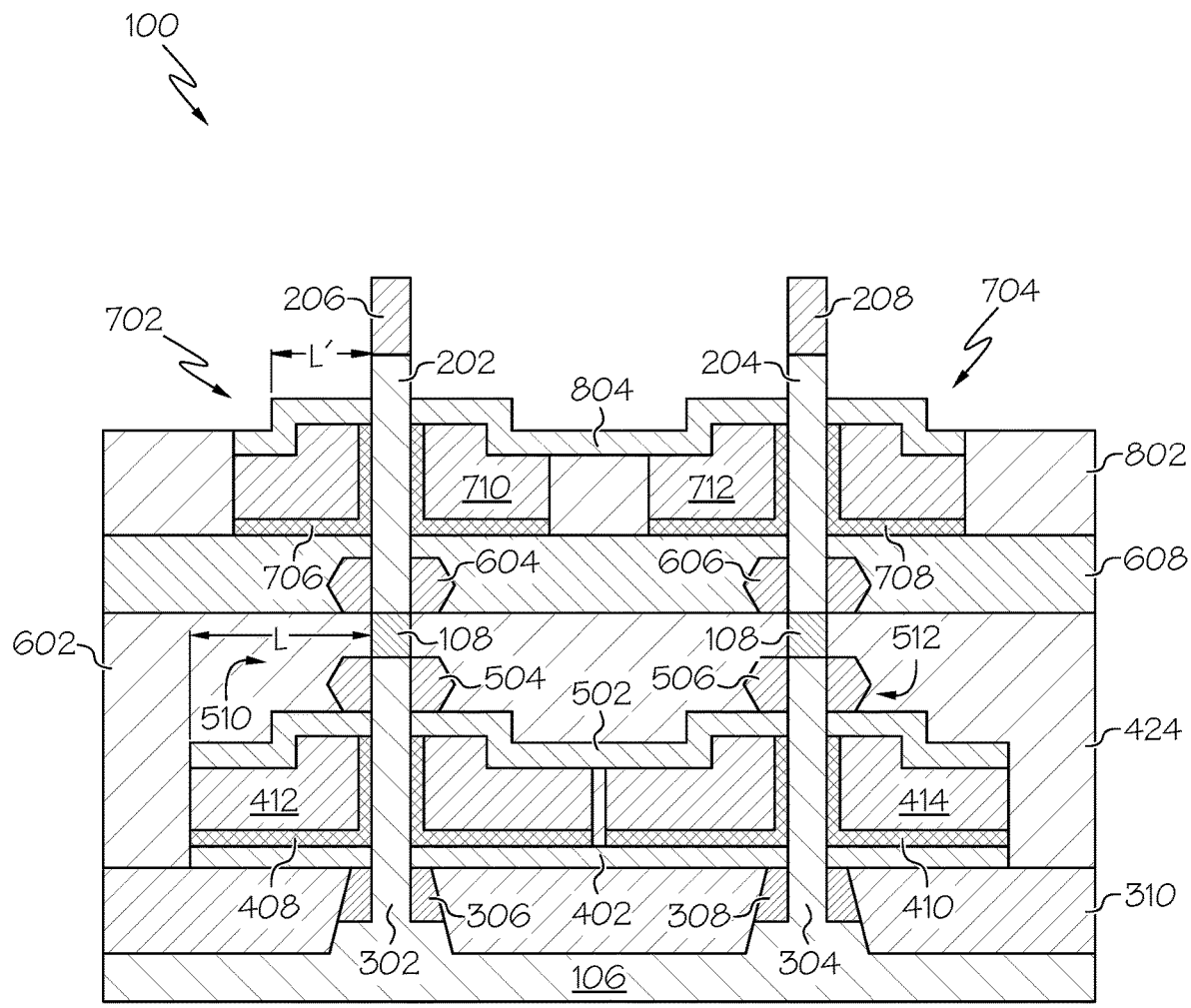
FIG. 8 is a cross-sectional view of the semiconductor device structure after the top gate structure has been patterned and a top insulating layer has been formed for the top VTFET according to one embodiment of the present invention.

The second gate structure 702, 704 may be formed using processes and comprise materials (including one or more work function layers) similar to those discussed above with respect to the first gate structure 404, 406. However, in one or more embodiments, the second gate structure 702, 704 is patterned to have a gate length that is less than the gate length of the underlying first gate structure 404, 406 as shown in FIG. 8. For example, FIG. 8 shows that the second gate structure 702, 704 comprises a gate length L' that is less than the gate length L of the first gate structure 404, 406. In other words, the first gate structure 404, 406 laterally extends farther from its channel region than the second gate structure 702, 704. This creates a "step" or "staircase" configuration of the first and second gate structures that enlarges the gate contact region to contact via thereby reducing the gate resistance.

FIG. 8 further shows that after the second gate structure 702, 704 has been formed an ILD 802 may be formed over the second gate structure 702, 704 and the second bottom spacer layer 608 similar to the ILD 424 discussed above with respect to FIG. 4. A topmost surface of the ILD 802 may be located below the topmost surface of the top fin 202, 204. A top surface of the ILD 802 may be co-planer with one or more portions of the top surface of the second gate structure 702, 704. FIG. 8 also shows that the ILD 802 has been formed, a fourth insulating spacer 804 (also referred to herein as the "second top spacer layer 804") may be formed on and in contact with a top surface of the second gate structure 702, 704 and a top surface of the ILD 802. The second top spacer layer 804 may be composed of a dielectric material that is the same as, or different from, the material that provides the second bottom spacer layer 608. The second top spacer layer 804 may be formed using processes and comprise materials similar to those discussed above with respect to the first top spacer layer 502.

Figure 9:
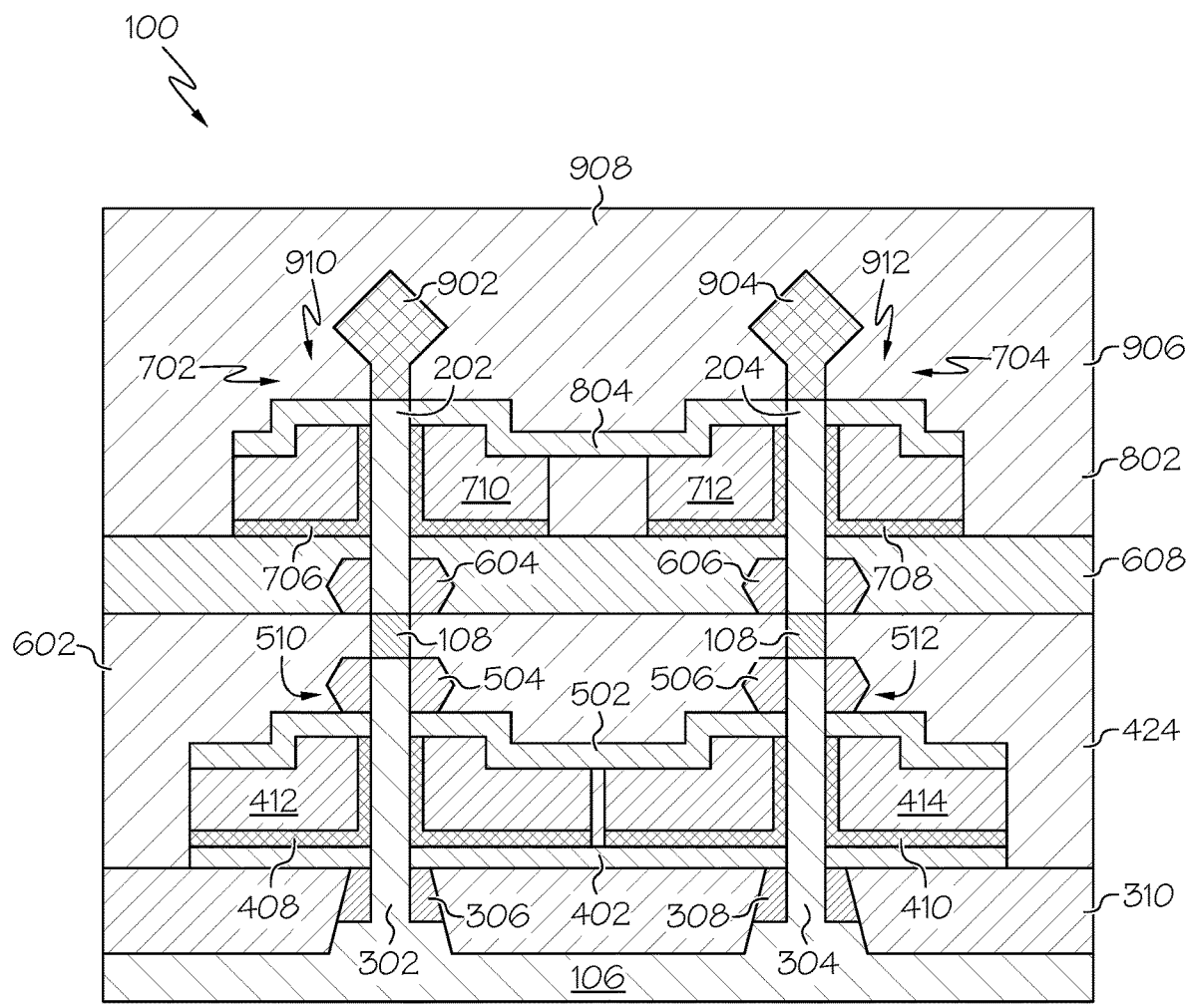
FIG. 9 is a cross-sectional view of a semiconductor device structure after a top source/drain and inter-layer dielectric have been formed for the top VTFET according to one embodiment of the present invention.

FIG. 9 shows that after the second top spacer layer 804 has been formed, a fourth epitaxial semiconductor region 902, 904 (also referred to herein as the "second top source/drain 902, 904") may then be formed in contact with at least the top portion of the top fin 202, 204. For example, after the second top spacer layer 804 has been formed another ILD 906 may deposited. The ILD 806 may be polished down to the top surface of the fin hard mask 206, 208 using, for example, CMP. After the ILD 906 is formed, the hard mask 206, 208 may be removed. For example, a selective etching process such as a wet etch process containing phosphoric acid may be used to etch away the hard mask 206, 208. This forms trenches within the ILD layer 906.

A selective epitaxy process may then be performed to form the second top source/drain layer 902, 904 similar to the other source/drain layers discussed above with respect to FIGS. 3, 5, and 6. The second top source/drain layer 902, 904 may be formed up from the exposed portions of the top fin 202, 204 within the trenches and extend above and laterally beyond the trenches. In one embodiment, a bottom surface of the second top source/drain layer 902, 904 contacts a top surface of the fin 202, 204. A top portion of the second top source/drain layer 902, 904 may extend above and laterally beyond the trenches, and may further contact a top surface of the ILD 906. The second top source/drain layer 902, 904 may comprise a faceted configuration. However, it should be noted that, non-faceted epitaxy and/or multiple epitaxy steps can be used to form the second top source/drain layer 902, 904 without limiting the scope of the present invention. A single second top source/drain layer 902, 904 (merged) may be formed for multiple fins 202, 204 or a separate second top source/drain layers 902, 904 may be formed for each fin.

The second top source/drain layer 902, 904 may include a semiconductor material that is the same as, or different from, the semiconductor material that provides the second bottom source/drain layer 604, 606. The second top source/drain layer 902, 904 may also include a dopant of the second conductivity type. The dopant may be provided during the selective epitaxial growth process by in-situ doping, or after the selective epitaxial growth process by ion implantation or gas phase doping. An anneal may be performed to drive dopant in the second top source/drain layer 902, 904 into the top portion of the top fin 202, 204, forming a fourth doped fin region within the top portion of the top fin 202, 204. Collectively, a fourth doped fin region and a surrounding second top source/drain layer 902, 904 constitute another source/drain region for each second vertical FET. An additional ILD 908 may then be deposited to cover the second top source/drain layer 902, 904.

A second (top) VTFET 910, 912 is thus formed stacked on a respective first VTFET 510, 512. The second VTFET 910, 912 may have a conductivity type that is the same as, or different from, the conductivity type of the first VTFET 510, 512. For example and when the first VTFET 510, 512 is a p-type FET, the second VTFET 910, 912 may be an n-type FET or a p-type FET. The stack of the first VTFET 510, 512 and the second VTFET 910, 912 may thus be n-type FET/p-type FET, n-type FET/n-type FET, p-type FET/p-type FET or p-type FET/n-type FET.

The second VTFET 910, 912 may comprise, from bottom to top, a first source/drain region including a first doped fin region located within the top fin 202, 204 and a second bottom source/drain layer 604, 606 laterally contacting the first doped fin region; a second gate structure 702, 704 laterally contacting a channel region of the top fin 202, 204; and a second source/drain region including a second doped fin region located within the top fin 202, 204 and a second top source/drain 902, 904 laterally contacting the second doped fin region. The first source/drain region of the second VTFET 910, 912 may be separated from the second gate structure 702, 704 by a second bottom spacer layer 608 disposed between the second bottom source/drain layer 604, 606 and the second gate structure 702, 704. The second source/drain region of the second VTFET 910, 912 may be separated from the second gate structure 702, 704 by a second top spacer layer 804 disposed between the second top source/drain 902, 904 and the second gate structure 702, 704.

Figure 10:
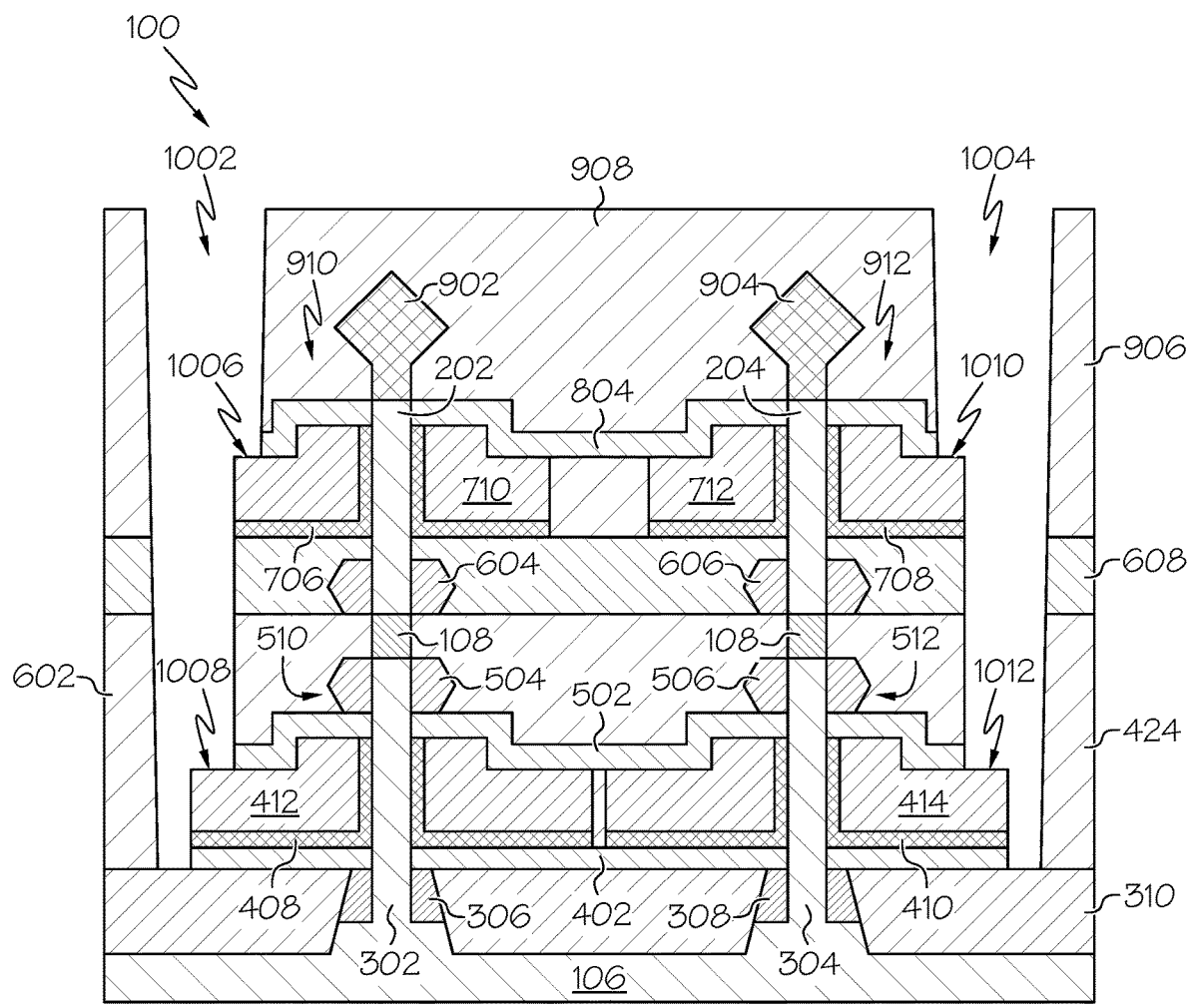
FIG. 10 is a cross-sectional view of the semiconductor device structure after a gate via trench has been formed exposing a first portion of the gate structures for the top and bottom VTFETs according to one embodiment of the present invention.

After the second VTFET 910, 912 has been formed and the additional ILD 908 deposited, one or more super vias (trenches) 1002, 1004 are formed as shown in FIG. 10. The via 1002, 1004 may be formed through the ILD layers 802, 906, 908 of the top portion of the stack comprising the top VTFETs 902, 904; the second bottom spacer layer 608; and the ILD layers 424, 602 of the bottom portion of the stack comprising the bottom VTFETs 510, 512. In one embodiment, a lithography process may be used to first pattern the gate contact vias 1002, 1004 followed by a high aspect ratio directional RIE. The via formation process exposes a top surface of a portion of the isolation region 310. FIG. 10 further shows that the vias 1002, 1004 formation process etches a portion of the first top spacer 502 and a portion of the second top spacer 804 thereby exposing a portion 1006 to 1012 of the top surface of the conductive gate layers 412, 414, 710, 712 of the first and second VTFETs. In one embodiment, the exposed portions of the conductive gate layers 412, 414, 710, 712 comprise the work function metal layer.

Figure 11:
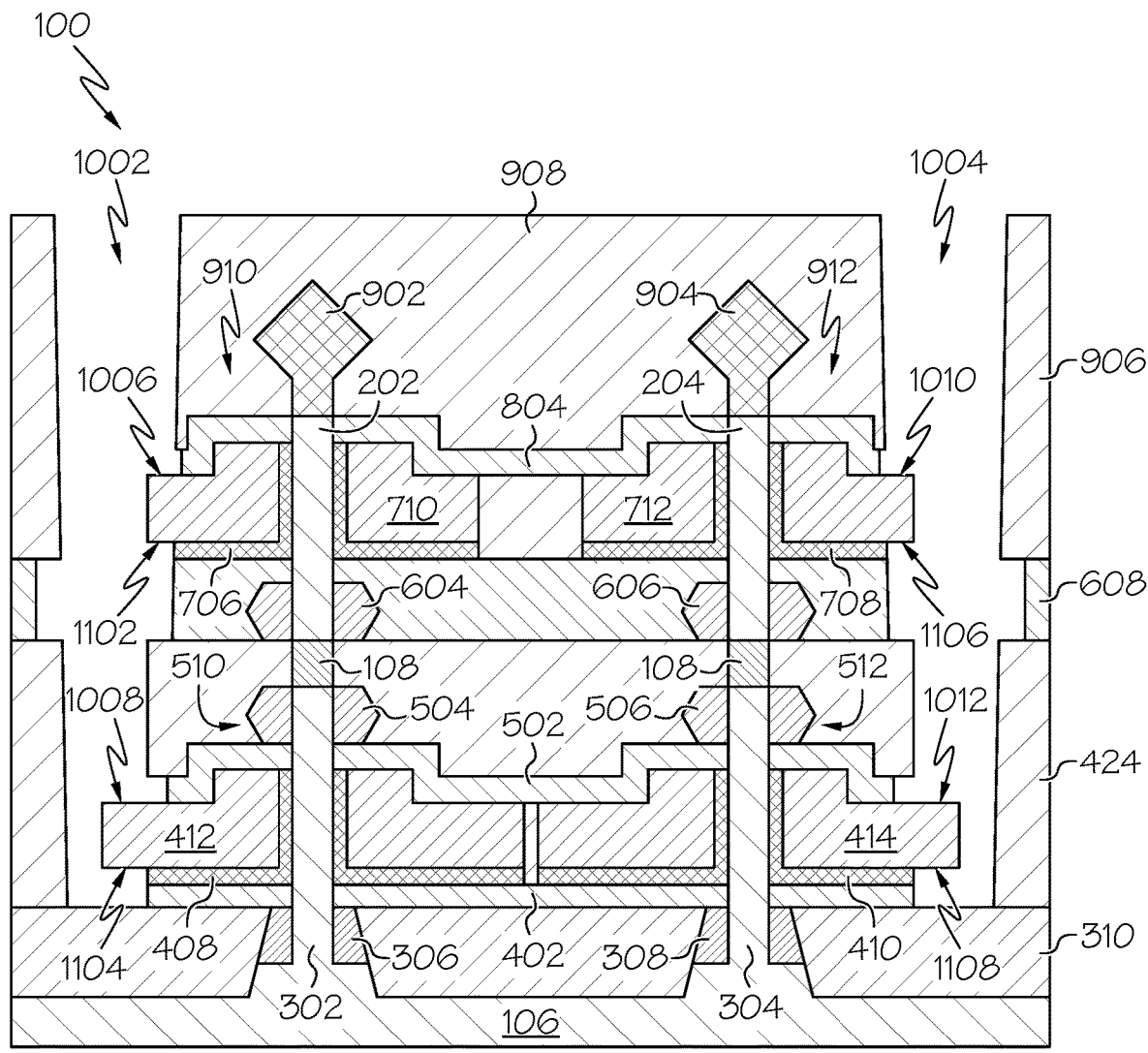
FIG. 11 is a cross-sectional view of the semiconductor device structure after a second portion of the gate structures for the top and bottom VTFETs have been exposed in the gate via according to one embodiment of the present invention.

FIG. 11 shows that a second etching process is performed to selectively etch a portion of the first bottom spacer 402, a portion of the second bottom spacer 608, and a portion of the gate insulating layer 408, 410, 706, 708 of each gate structure 404, 406, 702, 704 thereby exposing a portion 1102 to 1108 of the bottom surface of the conductive gate layers 412, 414, 710, 712 of the first and second VTFETs. It should be noted that, in some embodiments, the first and bottom spacer layers 402, 608 may not be etched. In one embodiment, the exposed portions of the conductive gate layers 412, 414, 710, 712 comprise the work function metal layer.

Figure 12:
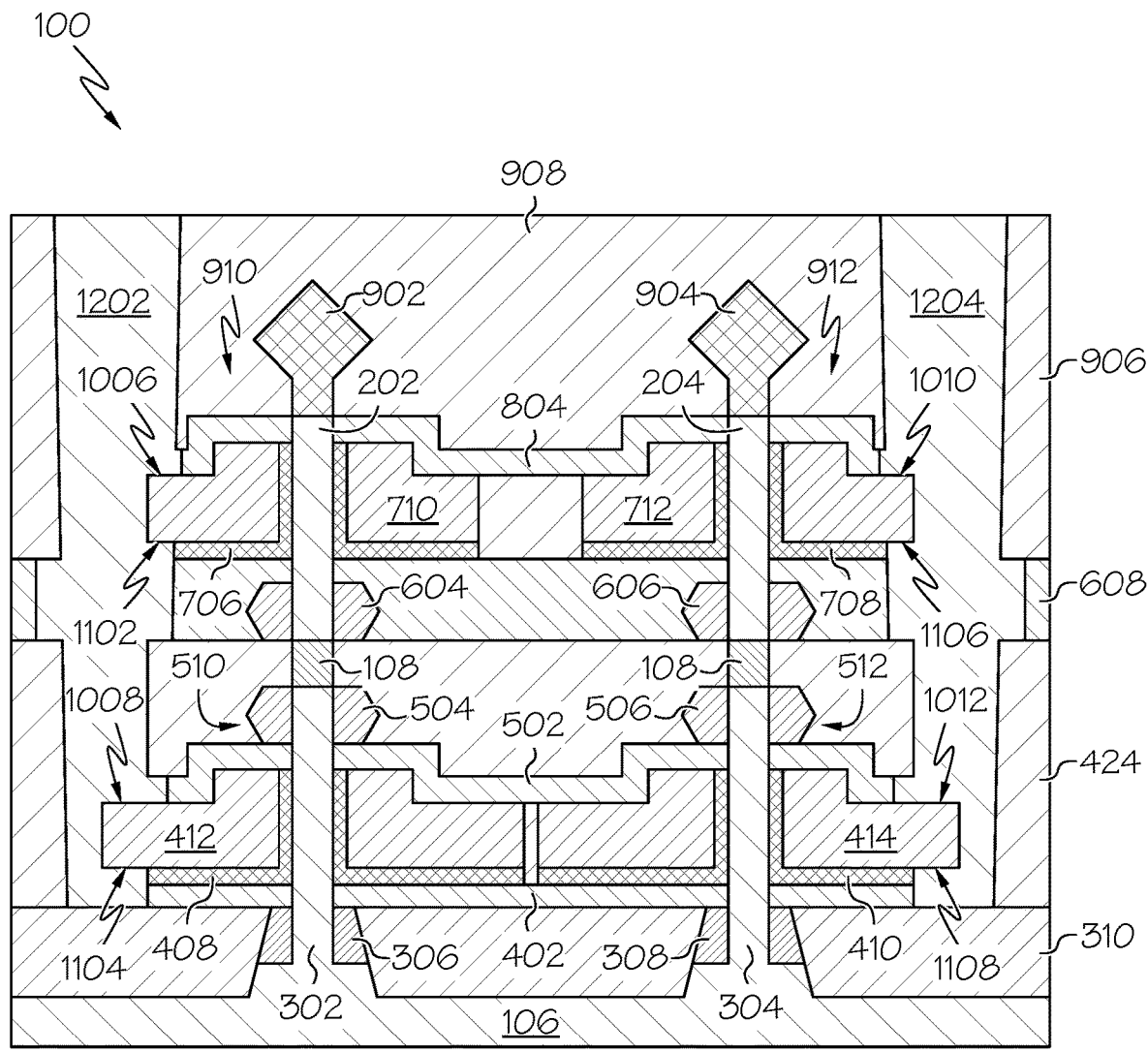
FIG. 12 is a cross-sectional view of the semiconductor device structure after a gate via contact has been formed in contact with the exposed portions of both the top and bottom VTFETs according to one embodiment of the present invention.

After the super vias 1002, 1004 have been formed and portions 1102 to 1108 of the conductive gate layers exposed, a gate via metallization process is performed as shown in FIG. 12. For example, conductive material my be deposited into the vias 1002, 1004 to form gate contacts 1202, 1204 that connect the gate 404, 406 of the bottom VTFET 510, 512 to the gate 702, 704 of the top VTFET 910, 912. The contacts 1202, 1204 may be formed using a process such as CVD, PVD, ALD, or electroplating processes or some combination of these processes. The conductive metal may include, but is not limited to, tungsten, cobalt, copper, aluminum, silver, gold and alloys thereof. Portions of the contacts 1202, 1204 wrap around and contact the exposed portions 1006 to 1012 and 1102 to 1108 of the conductive gate layers 412, 414, 710, 712.

Figure 13:
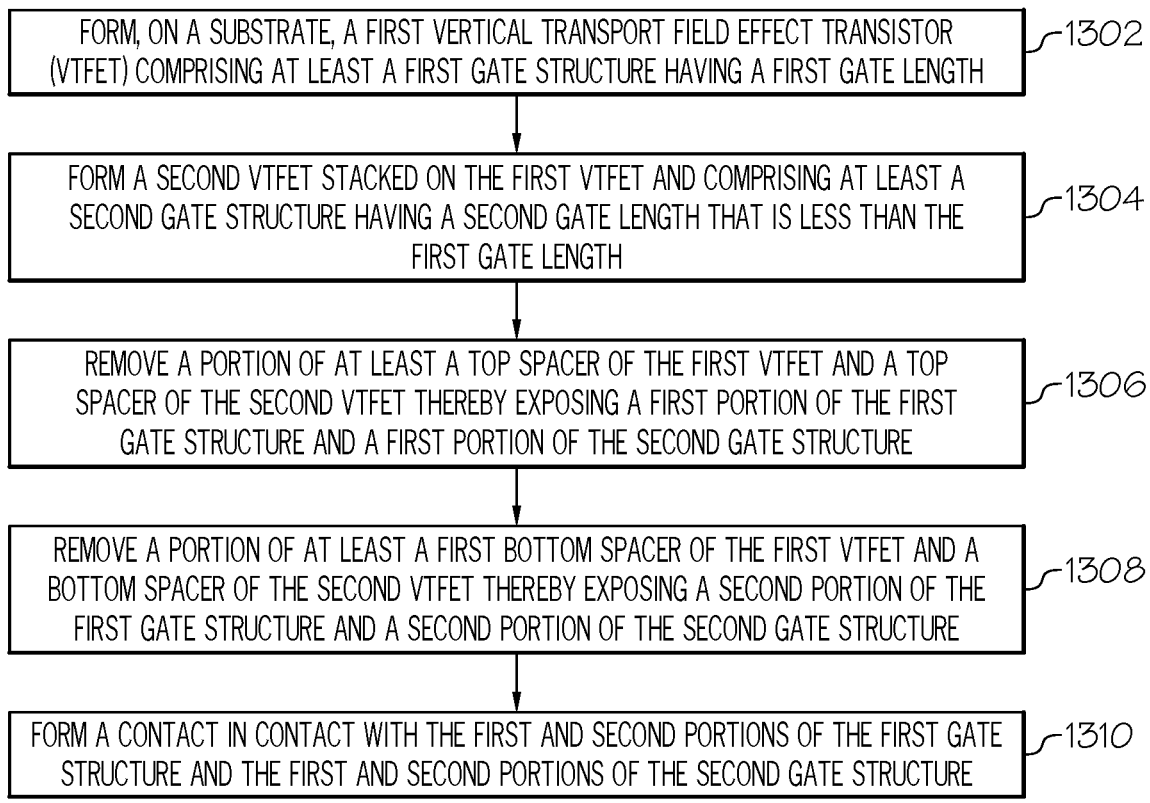
FIG. 13 is an operational flow diagram illustrating one example of a process for forming a stacked VTFET structure according to one embodiment of the present invention.

FIG. 13 is an operational flow diagram illustrating one example of a process for forming stacked VTFETs. It should be noted that each of the steps shown in FIG. 13 has been discussed in greater detail above with respect to FIGS. 1 to 12. A first VTFET is formed on a substrate and comprises at least a first gate structure having a first gate length, at step 1302. A second VTFET is formed stacked on the first VTFET and comprises at least a second gate structure having a second gate length that is less than the first gate length, at step 1304. A portion of at least a top spacer of the first VTFET and a top spacer of the second VTFET are removed thereby exposing a first portion of the first gate structure and a first portion of the second gate structure, at step 1306. A portion of at least a first bottom spacer of the first VTFET and a bottom spacer of the second VTFET are removed thereby exposing a second portion of the first gate structure and a second portion of the second gate structure, at step 1308. A contact is formed in contact with the first and second portions of the first gate structure and the first and second portions of the second gate structure, at step 1310.

Although specific embodiments have been taught, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

It should be noted that some features of the present invention may be used in one embodiment thereof without use of other features of the present invention. As such, the foregoing description should be considered as merely illustrative of the principles, teachings, examples, and exemplary embodiments of the present invention, and not a limitation thereof.

Also note that these embodiments are only examples of the many advantageous uses of the innovative teachings herein. In general, statements made in the specification of the present application do not necessarily limit any of the various claimed embodiments. Moreover, some statements may apply to some inventive features but not to others.

What is claimed is:

1. A semiconductor device structure comprising at least:
   a first vertical transport field effect transistor (VTFET) comprising at least a first gate structure having a first gate length;
   a second VTFET stacked on the first VTFET and comprising at least a second gate structure having a second gate length that is less than the first gate length; and
   an insulating layer formed on the first VTFET and insulating a first semiconductor fin of the first VTFET from a second semiconductor fin of the second VTFET.

2. The semiconductor device structure of claim 1, further comprising:
   a gate contact formed in contact with a portion of the first gate structure and a portion of the second gate structure.

3. The semiconductor device structure of claim 2, wherein the first VTFET further comprises:
   a bottom source/drain layer in contact with sidewalls of the first semiconductor fin; and
   a bottom insulating layer in contact with the bottom source/drain layer and sidewalls of the first semiconductor fin, and
   wherein the second VTFET further comprises:

a bottom source/drain layer in contact with sidewalls of the second semiconductor fin; and a bottom insulating layer in contact with the bottom source/drain layer and sidewalls of the second semiconductor fin.

4. The semiconductor device structure of claim 3, wherein the first gate structure is formed in contact with the bottom insulating layer and the first semiconductor fin of the first VTFET, and wherein the second gate structure is formed in contact with the bottom insulating layer and the second semiconductor fin of the second VTFET.

5. The semiconductor device structure of claim 3, wherein the first VTFET further comprises a top insulating layer formed on and in contact with at least the first gate structure, and a top source/drain layer formed on and in contact with at least the first semiconductor fin of the first VTFET, wherein the second VTFET further comprises a top insulating layer formed on and in contact with at least the second gate structure, and a top source/drain layer formed on and in contact with at least the second semiconductor fin of the second VTFET.

6. The semiconductor device structure of claim 1, wherein the first VTFET and the second VTFET comprise one of a same doping type or a different doping type.

7. A semiconductor device structure comprising at least:

a first vertical transport field effect transistor (VTFET) comprising at least a first gate structure having a first gate length;

a second VTFET stacked on the first VTFET and comprising at least a second gate structure having a second gate length that is less than the first gate length;

a gate contact that connects the first gate structure to the second gate structure; and an insulating layer formed on the first VTFET and insulating a first semiconductor fin of the first VTFET from a second semiconductor fin of the second VTFET.

8. The semiconductor device structure of claim 7, further comprising:

a gate contact formed in contact with a portion of the first gate structure and a portion of the second gate structure.

9. The semiconductor device structure of claim 8, wherein the first VTFET further comprises:

a bottom source/drain layer in contact with sidewalls of the first semiconductor fin; and a bottom insulating layer in contact with the bottom source/drain layer and sidewalls of the first semiconductor fin, and wherein the second VTFET further comprises:

a bottom source/drain layer in contact with sidewalls of the second semiconductor fin; and a bottom insulating layer in contact with the bottom source/drain layer and sidewalls of the second semiconductor fin.

10. The semiconductor device structure of claim 9, wherein the first gate structure is formed in contact with the bottom insulating layer and the first semiconductor fin of the first VTFET, and wherein the second gate structure is formed in contact with the bottom insulating layer and the second semiconductor fin of the second VTFET.

11. The semiconductor device structure of claim 9, wherein the first VTFET further comprises a top insulating layer formed on and in contact with at least the first gate structure, and a top source/drain layer formed on and in contact with at least the first semiconductor fin of the first VTFET, wherein the second VTFET further comprises a top insulating layer formed on and in contact with at least the second gate structure, and a top source/drain layer formed on and in contact with at least the second semiconductor fin of the second VTFET.

12. The semiconductor device structure of claim 7, wherein the first VTFET and the second VTFET comprise one of a same doping type or a different doping type.

13. An integrated circuit comprising:

a stacked vertical transport field effect transistor (VTFET) device, wherein the stacked VTFET device comprises a first vertical transport field effect transistor (VTFET) comprising at least a first gate structure having a first gate length;

a second VTFET stacked on the first VTFET and comprising at least a second gate structure having a second gate length that is less than the first gate length; and an insulating layer formed on the first VTFET and insulating a first semiconductor fin of the first VTFET from a second semiconductor fin of the second VTFET.

14. The integrated circuit of claim 13, wherein the stacked VTFET device further comprises:

a gate contact formed in contact with a portion of the first gate structure and a portion of the second gate structure.

15. The integrated circuit of claim 14, wherein the first VTFET further comprises:

a bottom source/drain layer in contact with sidewalls of the first semiconductor fin; and a bottom insulating layer in contact with the bottom source/drain layer and sidewalls of the first semiconductor fin, and wherein the second VTFET further comprises:

a bottom source/drain layer in contact with sidewalls off the second semiconductor fin; and a bottom insulating layer in contact with the bottom source/drain layer and sidewalls of the second semiconductor fin.

16. The integrated circuit of claim 15, wherein the first gate structure is formed in contact with the bottom insulating layer and the first semiconductor fin of the first VTFET, and wherein the second gate structure is formed in contact with the bottom insulating layer and the second semiconductor fin of the second VTFET.

17. The integrated circuit of claim 15, wherein the first VTFET further comprises a top insulating layer formed on and in contact with at least the first gate structure, and a top source/drain layer formed on and in contact with at least the first semiconductor fin of the first VTFET, wherein the second VTFET further comprises a top insulating layer formed on and in contact with at least the second gate structure, and a top source/drain layer formed on and in contact with at least the second semiconductor fin of the second VTFET.

18. The integrated circuit of claim 13, wherein the first VTFET and the second VTFET comprise one of a same doping type or a different doping type.

* * * * *